US008134684B2

(12) United States Patent
Zimmerman et al.

(10) Patent No.: US 8,134,684 B2
(45) Date of Patent: Mar. 13, 2012

(54) IMMERSION LITHOGRAPHY USING HAFNIUM-BASED NANOPARTICLES

(75) Inventors: Paul A. Zimmerman, Cedar Creek, TX (US); Jeffrey Byers, Austin, TX (US); Carita Simons, legal representative, Lexington, TX (US)

(73) Assignees: Sematech, Inc., Austin, TX (US); Intel Corporation, Austin, TX (US)

( * ) Notice: Subject to any disclaimer, the term of this patent is extended or adjusted under 35 U.S.C. 154(b) by 808 days.

(21) Appl. No.: 12/035,963

(22) Filed: Feb. 22, 2008

(65) Prior Publication Data

US 2009/0213346 A1 Aug. 27, 2009

(51) Int. Cl.
*G03B 27/42* (2006.01)

(52) U.S. Cl. .......................... 355/53; 355/30

(58) Field of Classification Search .............. 355/30, 355/53
See application file for complete search history.

(56) References Cited

U.S. PATENT DOCUMENTS

| 3,282,857 | A | 11/1966 | Fitch et al. ............... 516/90 |
| 5,032,546 | A | 7/1991 | Giannelis et al. ................ 501/3 |
| 5,032,547 | A | 7/1991 | Giannelis et al. ................ 501/3 |
| 5,202,152 | A | 4/1993 | Giannelis et al. .............. 427/108 |
| 5,219,611 | A | 6/1993 | Giannelis et al. .............. 427/162 |
| 5,260,094 | A | 11/1993 | Giannelis et al. ............... 427/79 |
| 5,554,670 | A | 9/1996 | Giannelis et al. ............. 523/209 |
| 5,955,535 | A | 9/1999 | Vaia et al. .................... 524/791 |
| 6,010,805 | A | 1/2000 | Scanlon, Jr. et al. .......... 429/307 |
| 6,225,374 | B1 | 5/2001 | Vaia et al. ................... 523/216 |
| 7,148,282 | B2 | 12/2006 | Giannelis et al. ............. 524/445 |
| 2002/0182541 | A1* | 12/2002 | Gonsalves ................ 430/287.1 |
| 2003/0099897 | A1* | 5/2003 | Fedynyshyn ................. 430/192 |
| 2004/0191669 | A1 | 9/2004 | Whitlock et al. ............ 430/270.1 |
| 2006/0072088 | A1* | 4/2006 | Lipson et al. ................... 355/53 |
| 2007/0032091 | A1 | 2/2007 | Heald et al. ................... 438/758 |
| 2007/0032585 | A1 | 2/2007 | Giannelis et al. ............. 524/445 |
| 2007/0054994 | A1 | 3/2007 | Kanz et al. ................... 524/105 |
| 2007/0105050 | A1* | 5/2007 | Jahromi et al. ............... 430/311 |
| 2008/0050857 | A1 | 2/2008 | Wu et al. ........................ 438/47 |
| 2008/0090986 | A1* | 4/2008 | Khanarian et al. .............. 528/15 |

FOREIGN PATENT DOCUMENTS

EP 0 965 618 12/1999
(Continued)

OTHER PUBLICATIONS

Tang et al., "Solid-solution nanoparticles: use of a nonhydrolytic sol-gel synthesis to prepare $HfO_2$ and $Hf_xZr_{1-x}O_2$ nanocrystals," *Chem. Mater.*, 16:1336-1342, 2004.

(Continued)

*Primary Examiner* — Edward J Glick
*Assistant Examiner* — Mesfin T Asfaw
(74) *Attorney, Agent, or Firm* — Fulbright & Jaworski L.L.P.

(57) ABSTRACT

Method, apparatus, and composition of matter suited for use with, for example, immersion lithography. The composition of matter includes hafnium dioxide nanoparticles having diameters less than or equal to about 15 nanometers. The apparatus includes the composition of matter, a light source, a platform for supporting a work piece, and a lens element. The method includes providing a light source, providing a lens element between the light source and a work piece, providing the composition of matter between the lens element and the work piece, and exposing the work piece to light provided by the light source by passing light from the light source through the lens element and the composition of matter to the work piece.

15 Claims, 7 Drawing Sheets

FOREIGN PATENT DOCUMENTS

| | | |
|---|---|---|
| EP | 1 375 597 | 1/2004 |
| EP | 1 720 075 | 11/2006 |
| EP | 1 806 621 | 7/2007 |
| EP | 1 939 689 | 7/2008 |
| JP | 2006-273709 | 10/2006 |
| WO | WO 2005/029180 | 3/2005 |
| WO | WO 2008/008275 | 1/2008 |
| WO | WO 2008/080521 | 7/2008 |
| WO | WO 2008/148411 | 12/2008 |

OTHER PUBLICATIONS

Partial Search Report (Invitation to Pay Additional Fees) issued in Application No. PCT/US2009/034852, date of mailing Jul. 6, 2009.

Chumanov and Evanoff, "Nanocomposite liquids for 193 nm immersion lithography: a progress report," *Proceedings of SPIE*, 5753:847-50, 2005.

Toraya et al., "Preparation of fine monoclinic hafnia poweders by hydrothermal oxidation," *Communications of the American Ceramic Society*, 65:C-72, 1982.

Yoshimura and Sōmiya, "Hydrothermal synthesis of crystallized nano-particles of rare earth-doped zircoina and hafnia," *Materials Chemistry and Physics*, 61:1-8, 1999.

International Search Report and Written Opinion, issued in Application No. PCT/US2009/034852, mail date Oct. 23, 2009.

Tang et al., "Solid-solution nanoparticles: use of a nonhydrolytic sol-gel synthesis to prepare $HfO_2$ abd $Hf_xZr_{1-x}O_2$ nanocrystals," *Chem. Mater.*, 16:1336-1342, 2004.

Zimmerman et al., "The use of nanocomposite materials for high refractive index immersion lithography," *Journal of Photopolymer Science and Technology*, 21:621-629, 2008 (Abstract).

\* cited by examiner

| Nanoparticle Volume Concentration (volume %) in Resist | Calculated Refractive Index (RI) |
|---|---|
| 0% | 1.700 |
| 2% | 1.715 |
| 5% | 1.739 |
| 8% | 1.763 |
| 10% | 1.778 |
| 15% | 1.819 |
| 20% | 1.860 |
| 23% | 1.878 |
| 25% | 1.911 |

IMMERSION LITHOGRAPHY USING HAFNIUM-BASED NANOPARTICLES

BACKGROUND

1. Field

The present invention relates generally to semiconductor fabrication and TFT LCD fabrication, and more particularly to immersion lithography.

2. Description of Related Art

Semiconductor fabrication processes and thin film transistor liquid crystal display ("TFT LCD") fabrication processes generally include an optical lithography step where light passes through a mask that includes a pattern. The pattern is focused by a lens and is projected onto the surface of a semiconductor wafer or TFT LCD substrate that is coated with a thin layer of resist. The pattern may be a particular layer of the device that includes transistor structures, contacts, conductors, and so forth. As feature sizes of devices continue to decrease, the resolution of the lithography process becomes more important. The resolution of the lithography process, in particular the width of the conductors and spaces between the conductors, is proportional to the wavelength of light used for patterning, and inversely proportional to the numerical aperture of the lens. Ideally, the resolution of the lithography process is improved when the wavelength is small and the numerical aperture is large.

Immersion lithography is a technique in which lithographic exposure is performed with an immersion fluid introduced between the lens and the resist-coated wafer. Use of this technique may result in an increase in numerical aperture proportional to the refractive index of the immersion fluid. Typically, the immersion fluid is a layer of deionized ionized water, which may increase the numerical aperture at 193 nanometer incident electromagnetic radiation by a factor of up to 1.43 (the refractive index of water).

Further decrease in semiconductor device feature size may require improved resolution in the lithography process. Use of high refractive index immersion fluids and resists in the immersion lithography process may enable improved lithographic resolution without requiring the use of smaller wavelengths of light for patterning.

SUMMARY

Embodiments of the present methods, apparatuses, and compositions of matter may facilitate improved lithographic resolution through introduction of hafnium dioxide-based high refractive index materials.

Embodiments of the present compositions of matter include a medium and hafnium dioxide nanoparticles incorporated in the medium, the hafnium dioxide nanoparticles having diameters of about 15 nanometers or less.

Some embodiments of the present compositions of matter are immersion fluids. Embodiments that are immersion fluids may be aqueous or organic immersion fluids. Other embodiments of the present compositions of matter are resists.

Embodiments of the present apparatuses include a light source; a platform for supporting a work piece; a lens element positioned between the light source and the platform; and a composition of matter positioned between the lens element and the platform. The composition of matter may include a medium with hafnium dioxide nanoparticles incorporated in the medium, the hafnium dioxide nanoparticles having diameters of about 15 nanometers or less. The work piece may be a semiconductor wafer, TFT LCD substrate, or other article of manufacture that employs optical lithography in its fabrication process.

In some embodiments of the present apparatuses, the composition of matter is an immersion fluid. Other embodiments further include a resist positioned between the immersion fluid and the work platform. This resist may include a medium with incorporated hafnium dioxide nanoparticles having diameters less than or equal to about 15 nanometers. In some embodiments, the refractive index of the resist at 193 nanometer incident electromagnetic radiation is greater than or equal to the refractive index of the immersion fluid at 193 nanometer incident electromagnetic radiation.

In other embodiments of the present apparatuses, the composition of matter is a resist.

Embodiments of the present methods include providing a light source; providing a lens element between the light source and a work piece; providing a composition of matter between the lens element and the work piece; and exposing the work piece to light provided by the light source by passing light from the light source through the lens element and through the composition of matter to the work piece. The composition of matter may include a medium with hafnium dioxide nanoparticles incorporated in the medium, the hafnium dioxide nanoparticles having diameters of about 15 nanometers or less. The work piece may be a semiconductor wafer, TFT-LCD substrate, or other article of manufacture that employs optical lithography in its fabrication process.

In some embodiments of the present methods, the composition of matter is an immersion fluid. Some embodiments further include providing a resist positioned between the immersion fluid and the work platform. This resist may include a medium with incorporated hafnium dioxide nanoparticles, the hafnium dioxide nanoparticles having a diameter less than or equal to about 15 nanometers. In some embodiments, the refractive index of the resist at 193 nanometer incident electromagnetic radiation is greater than or equal to the refractive index of the immersion fluid at 193 nanometer incident electromagnetic radiation.

In other embodiments of the present methods, the composition of matter is a resist.

Details associated with the embodiments described above and others are presented below. Other embodiments of the present actuators are possible.

BRIEF DESCRIPTION OF THE DRAWINGS

The following drawings form part of the present specification and are included to further demonstrate certain aspects of the present methods, apparatuses, and compositions of matter. The drawings illustrate by way of example and not limitation. Identical reference numerals do not necessarily indicate an identical structure. Rather, the same reference numeral may be used to indicate a similar feature or a feature with similar functionality. Not every feature of each embodiment is labeled in every figure in which that embodiment appears, in order to keep the figures clear.

FIG. 7 is a table showing the refractive index obtained from embodiments of the present compositions of matter that include various concentrations of hafnium dioxide particles.

DESCRIPTION OF ILLUSTRATIVE EMBODIMENTS

The terms "comprise" (and any form of comprise, such as "comprises" and "comprising"), "have" (and any form of have, such as "has" and "having"), "contain" (and any form of contain, such as "contains" and "containing"), and "include" (and any form of include, such as "includes" and "including") are open-ended linking verbs. As a result, a system or method that "comprises," "has," "contains," or "includes" one or more elements possesses those one or more elements, but is not limited to possessing only those one or more elements or steps. Likewise, an element of a system or method that "comprises," "has," "contains," or "includes" one or more features possesses those one or more features, but is not limited to possessing only those one or more features. Furthermore, a structure that is configured in a certain way must be configured in at least that way, but also may be configured in a way or ways that are not specified.

The terms "a" and "an" are defined as one or more than one unless this disclosure explicitly requires otherwise. The term "about" is defined as at least close to (and includes) a given value or state (preferably within 10% of, more preferably within 1% of, and most preferably within 0.1% of).

Embodiments described herein provide improved resolution in the lithographic process by increasing the numerical aperture of the lithography system. Increased numerical aperture may be achieved by utilizing immersion fluids and/or resists that have a high refractive index compared to water. The present methods, apparatuses, and compositions of matter utilize hafnium dioxide nanoparticles having diameters of ten nanometers or less to increase the refractive index of materials, such as immersion fluids and resists.

Figure 1:
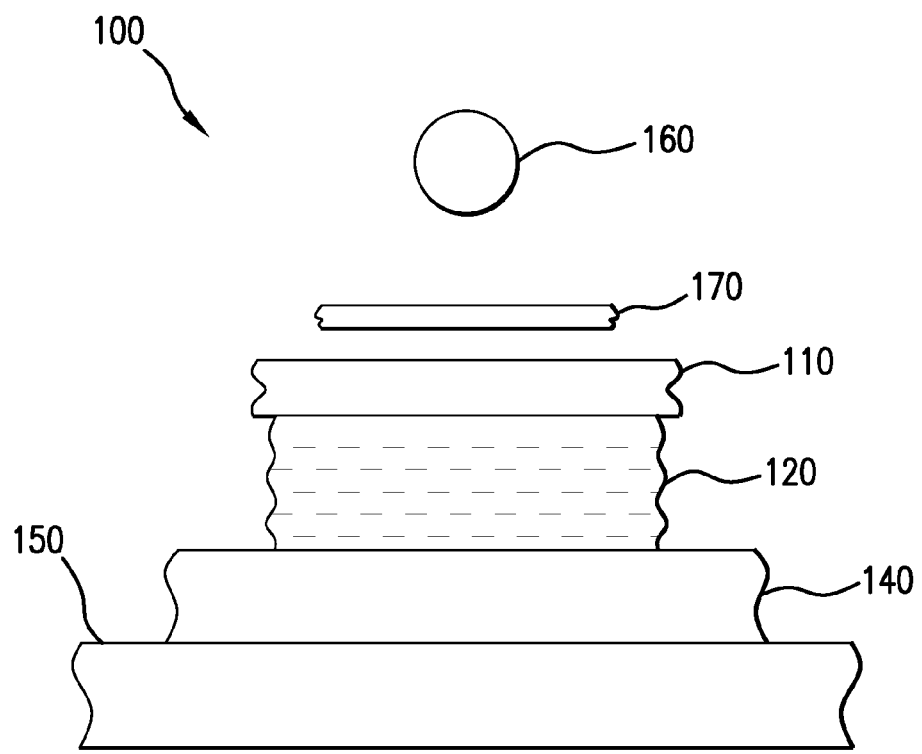
FIGS. 1 and 2 are cross-sectional views of embodiments of the present apparatuses and methods.
Figure 2:
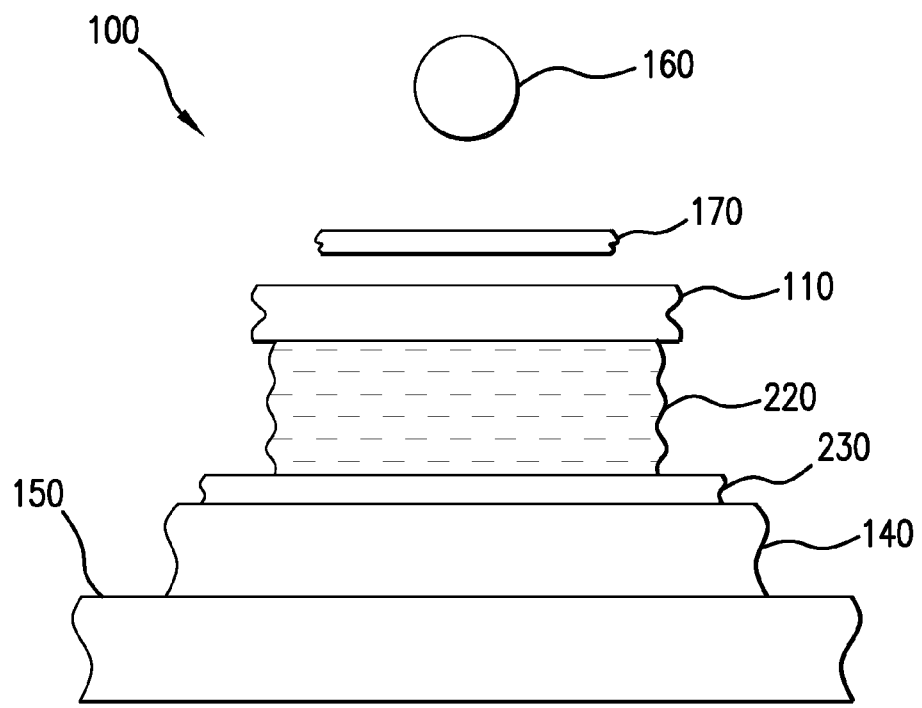

Examples of the present apparatuses and methods appear in cross-section in FIGS. 1 and 2. Apparatus 100 includes lens 110, composition of matter 120, platform 150, and light source 160. Also depicted in FIGS. 1 and 2 are mask 170 and work piece 140.

Work piece 140 may be a semiconductor wafer, TFT-LCD substrate, or other article of manufacture that employs optical lithography in its fabrication process. Referring to FIG. 2, work piece 140 is typically coated with resist 230 and is supported by platform 150 such that resist 230 coats the side of work piece 140 that faces lens 110. Platform 150 supports work piece 140 from the side opposite. One of ordinary skill in the art will recognize that platform 150 may support work piece 140 by mechanical, vacuum, electrostatic, and/or other methods.

Light source 160 may be a 193 nanometer (nm) wavelength source, producing 193 nm incident electromagnetic radiation. Excimer lasers based on ArF (Argon Fluorine) are commonly used in semiconductor manufacturing as 193 nm light sources, but other light sources (producing light at 193 nm or other wavelengths) may be employed. Light from light source 160 passes through mask 170 and lens element 110, composition of matter 120 (see FIG. 1) or immersion fluid 220 and resist 230 (see FIG. 2) to work piece 140.

Figure 3:
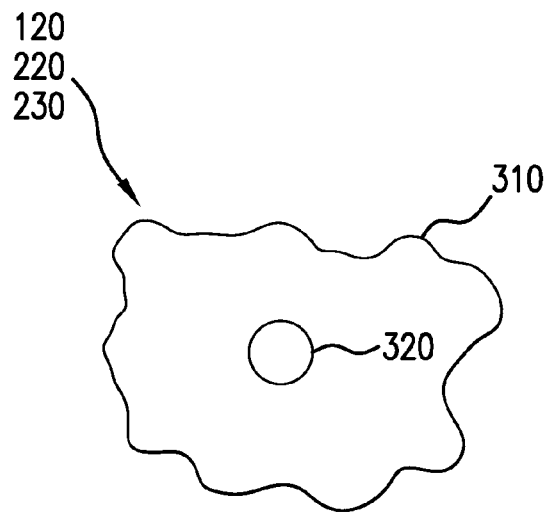
FIG. 3 depicts an embodiment of the present compositions of matter.

Referring to FIG. 3, composition of matter 120 includes hafnium dioxide nanoparticles 320 incorporated in medium 310. The phrase "hafnium dioxide nanoparticles incorporated in the medium" is defined herein to mean "hafnium dioxide nanoparticles dissolved, suspended, or homogeneously dispersed in the medium." Similarly, the term "incorporated hafnium dioxide nanoparticles" is defined to mean "dissolved, suspended, or homogeneously dispersed hafnium dioxide nanoparticles."

Hafnium dioxide nanoparticles 320 have diameters less than or equal to 15 nm. Since these nanoparticles are much smaller than 193 nm, light from light source 160 having a wavelength of 193 nm should not be scattered by hafnium dioxide nanoparticles 320. Hafnium dioxide also exhibits a high refractive index and low absorbance at 193 nm incident electromagnetic radiation (see FIG. 6). The inclusion of hafnium dioxide nanoparticles 320 results in composition of matter 120 having a refractive index of that is higher than the refractive index of medium 310 alone.

One method for synthesis of hafnium dioxide nanoparticles, including those having diameters of 15 nm or less, is described in Tang et al., "Solid-Solution Nanoparticles: Use of Nonhydrolytic Sol-Gel Synthesis to Prepare $HfO_2$ and $Hf_xZr_{1-x}O_2$ Nanocrystals", Chem. Mater., 16, 1336 (2004), the disclosure of which is expressly incorporated herein by reference.

Returning to FIG. 1, increasing the refractive index of composition of matter 120 results in an increased numerical aperture for apparatus 100, thereby improving the resolution of the lithographic process. The resolution that may be realized in the lithographic process is dependent on the refractive index values of all materials in the optical path (i.e., the light's path of travel from the light source to the work piece). Therefore, it may be desirable to increase the refractive index of an immersion fluid and/or a resist located in the optical path from light source 160 to work piece 140.

FIG. 2 is an embodiment of the present apparatuses and methods that includes immersion fluid 220 and resist 230. Immersion fluid 220 may be a composition of matter that uses hafnium dioxide nanoparticles to raise the refractive index of the immersion fluid.

In some embodiments of the present methods, apparatuses, and compositions of matter, immersion fluid 220 may be an immersion fluid based on hafnium dioxide nanoparticles in an aqueous solution. Simulation has shown that a refractive index of at least 1.64 at 193 nm incident electromagnetic radiation may be achieved through the inclusion of hafnium dioxide nanoparticles in a aqueous solution suitable for use as an immersion fluid. By way of comparison, the refractive index for water at 193 nm is 1.43.

Figure 4:
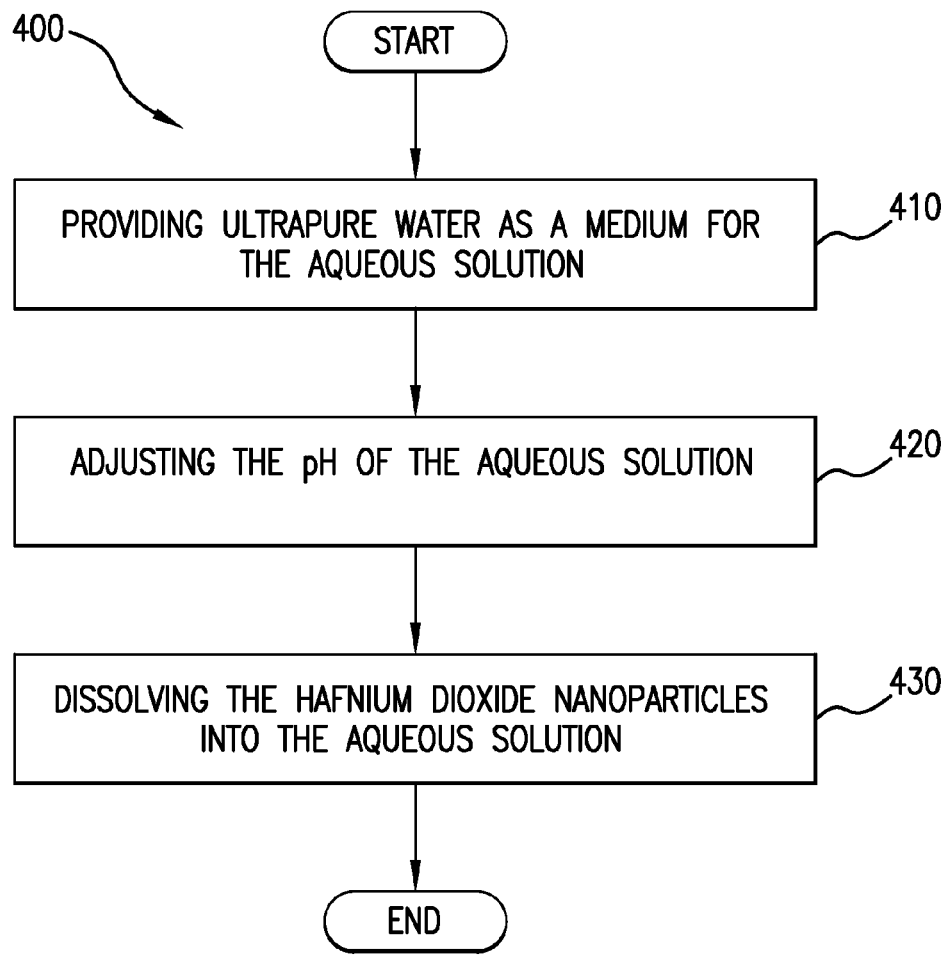
FIG. 4 is a flow chart depicting preparation of an embodiment of the present compositions of matter.

One method for preparing an embodiment of immersion fluid 220 having hafnium dioxide nanoparticles in an aqueous solution is depicted in FIG. 4. Process 400 involves providing ultrapure water as a medium for the aqueous solution (step 410), adjusting the pH of the aqueous solution to affect the amount of hafnium dioxide nanoparticles that will be dissolved in the solution (step 420), and dissolving the hafnium dioxide nanoparticles into the solution (step 430). Any strong or weak acid may be used to adjust the pH of aqueous solution immersion fluid 220, with concentrations preferably optimized to increase dissolution of the hafnium dioxide nanoparticles in immersion fluid 220 while minimizing any added contribution to the absorbance of immersion fluid 220 at the 193 nm wavelength. Determination of the proper volume fraction of hafnium dioxide nanoparticles is discussed below.

In other embodiments of the present methods, apparatuses, and compositions of matter, immersion fluid 220 may be an immersion fluid based on hafnium dioxide nanoparticles in an organic solution. Simulation has shown that a refractive index of at least 1.8 at 193 nm incident electromagnetic radiation may be achieved through the inclusion of hafnium dioxide nanoparticles in an organic solution using decalin (decahydronaphthalene) as the medium, as compared to the refractive index of 1.64 at 193 nm for decalin alone. One of ordinary skill in the art will recognize that other commercially available organic liquids may be used as an alternative to decalin including, for example: cyclohexane, ethylcyclohexane, methylcyclohexane dimethyladamantane bicyclohexyl, perhydropyrene, and perhydroflurene.

Figure 5:
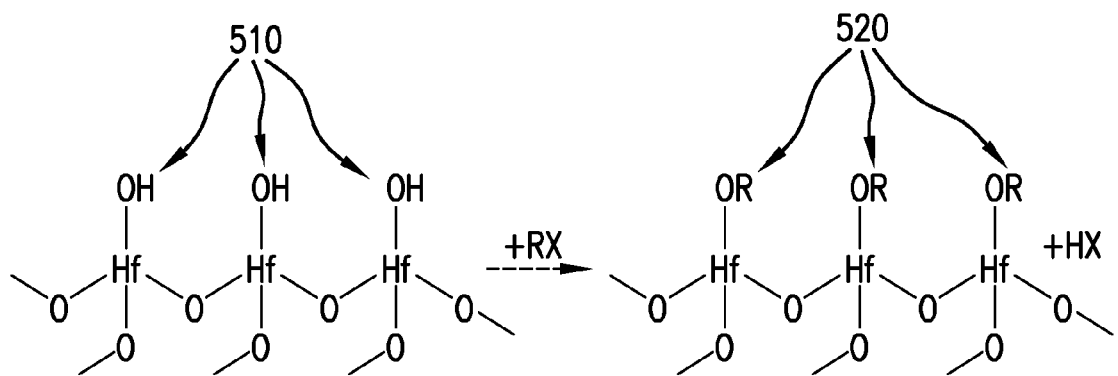
FIG. 5 is a schematic that depicts part of the surface of a hafnium dioxide nanoparticle that is being functionalized to aid dispersion into an aqueous or organic solution.

FIG. 5 depicts a method for preparing an organic solution-based embodiment of immersion fluid 220. This method functionalizes the hafnium dioxide nanoparticles to aid dispersion into an organic-based fluid by attaching dispersion tails onto the hafnium dioxide. Using either oxygen or hydroxyl terminated groups 510 on the hafnium, R groups 520 are attached. The nature of R group 520 may be side chains such as:

where n=0 to 10, and R' may be:

or some other chemical composition.

Other R groups may contain organic and/or inorganic species. The R group may contain S, N, Si, O, C, F, Cl, Br, I, and/or H, as well as a metallic element.

Returning to FIG. 2, resist 230 may be a composition of matter that uses hafnium dioxide nanoparticles to raise the refractive index of the resist film. Simulation has shown that the addition of hafnium dioxide nanoparticles to a resist suitable for use with a 193 nm wavelength light source may produce a resist film that achieves a refractive index of at least 1.9 at 193 nm incident electromagnetic radiation (see FIG. 7). Hafnium dioxide nanoparticles having 15 nm or smaller diameters are well-suited for implementation in resists used in 193 nm lithographic processes not only due to the material's high refractive index and low absorbance at 193 nm incident electromagnetic radiation, but also because the material is inert relative to 193 nm resist polymers currently in industrial use. Therefore, degradation of resist performance caused by inclusion of the material can be minimized without the need for implementing a new resist polymer.

Examples of 193 nm resist polymers well-suited for use with incorporated hafnium dioxide nanoparticles are any variation of resists formulated from a series of cycloaliphatic co- and terpolymers synthesized by: (1) Pd(II)-metal-catalyzed addition polymerization, (2) free radical polymerization, and (3) ring-opening metathesis polymerization (ROMP).

Figure 8A:
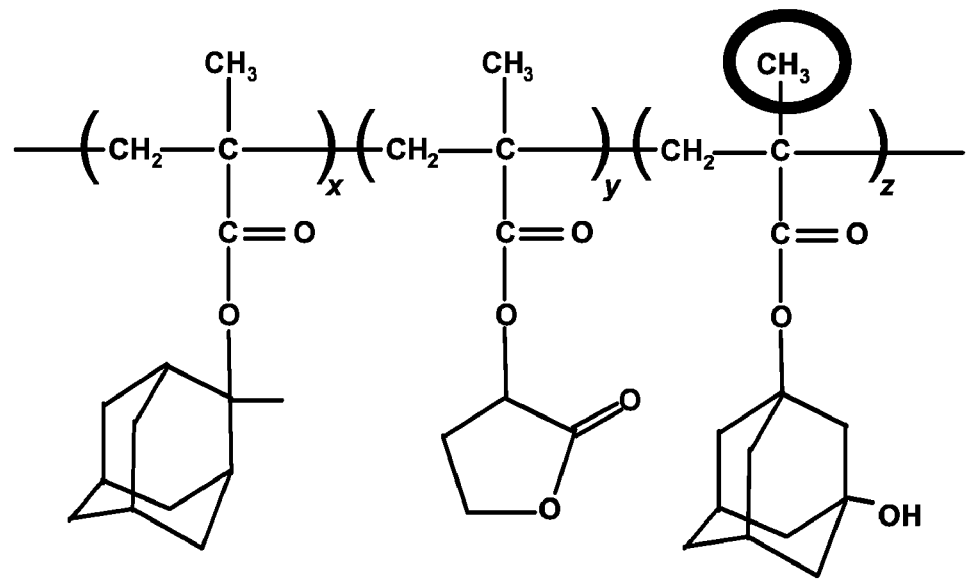
FIGS. 8A, 8B, and 8C depict examples of resists that may serve as the medium in embodiments of the present compositions of matter.
Figure 8B:
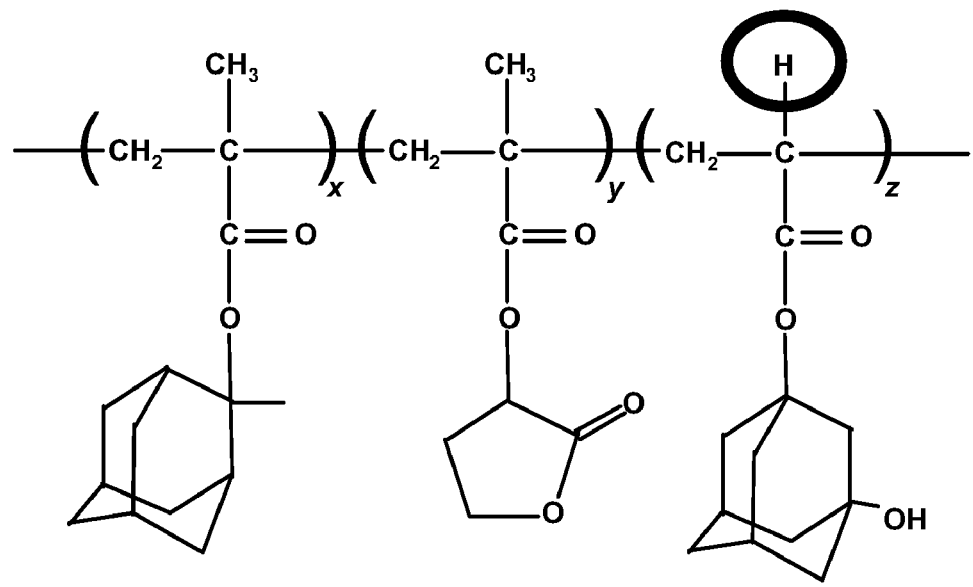
Figure 8C:
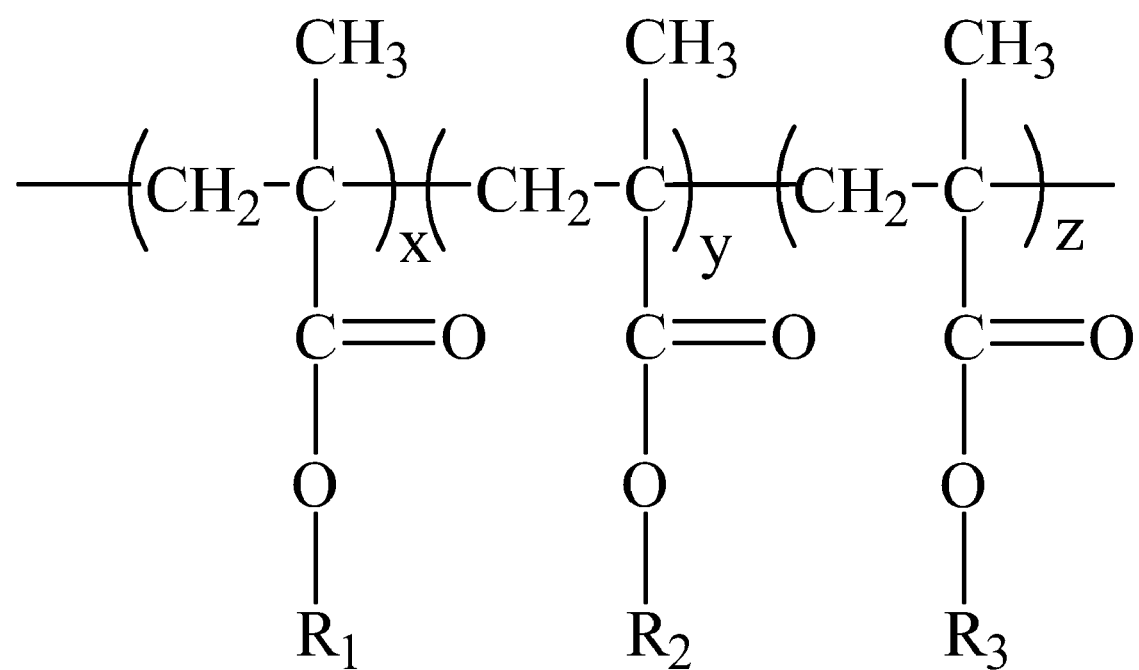

FIGS. 8A and 8B presents two specific examples of the 193 nm resist polymer described above. FIG. 8C illustrates an example of a generic structure of the 193 nm resist polymer example. In the generic polymer structure depicted in FIG. 8C, $R_1$, $R_2$ and $R_3$ correspond to various pendent groups that add specific functionality to the resist polymer. The x, y and z correspond to the fractional component of each monomer used to give a specific set of properties for the polymer The sum of x+y+z=1.

Smooth and uniform resist films exhibiting minimal streaking and no visible comets have been achieved. The parameters used for spinning these embodiments of resist 230 are:

Solvent: Cyclohexanone+PGMEA
Spin Speed/Time: 3000 rpm for 30 s
Bake Time: 120° C. for 60 s
Used a 193 methacrylate polymer at 2 wt %
Varied concentration of nanoparticles between 1 wt % and 3 wt %

Referring to the embodiment depicted in FIG. 2, it is desirable that the refractive index of resist 230 be higher than the refractive index of immersion fluid 220 at the wavelength of light produced by light source 160 (typically 193 nm) since improved resolution may be achieved when the respective refractive index values increase with successive materials encountered in the optical path from light source 160 to work piece 140. Either immersion fluid 220, resist 230, or both may be a composition of matter that uses hafnium dioxide nanoparticles to raise the refractive index of the particular material.

Synthesizing composition of matter 120 (and immersion fluid 220 or resist 230 for embodiments in which the immersion fluid or resist is a composition of matter using hafnium dioxide nanoparticles to raise its refractive index) requires calculating the proper volume fraction of nanoparticles needed to obtain the desired final refractive index of the composition of matter. The relationship between the final refractive index of the composition of matter, $n_f$, the refractive index of the hafnium dioxide nanoparticle solute, $n_s$, the refractive index of the medium, $n_m$, and the volume fraction of the hafnium dioxide nanoparticle solute in the composition of matter, $V_s$, may be estimated by the equation:

$$\frac{n_f^2 - 1}{n_f^2 + 2} = V_s \frac{n_s^2 - 1}{n_s^2 + 2} + (1 - V_s) \frac{n_m^2 - 1}{n_m^2 + 2}$$

Figure 6:
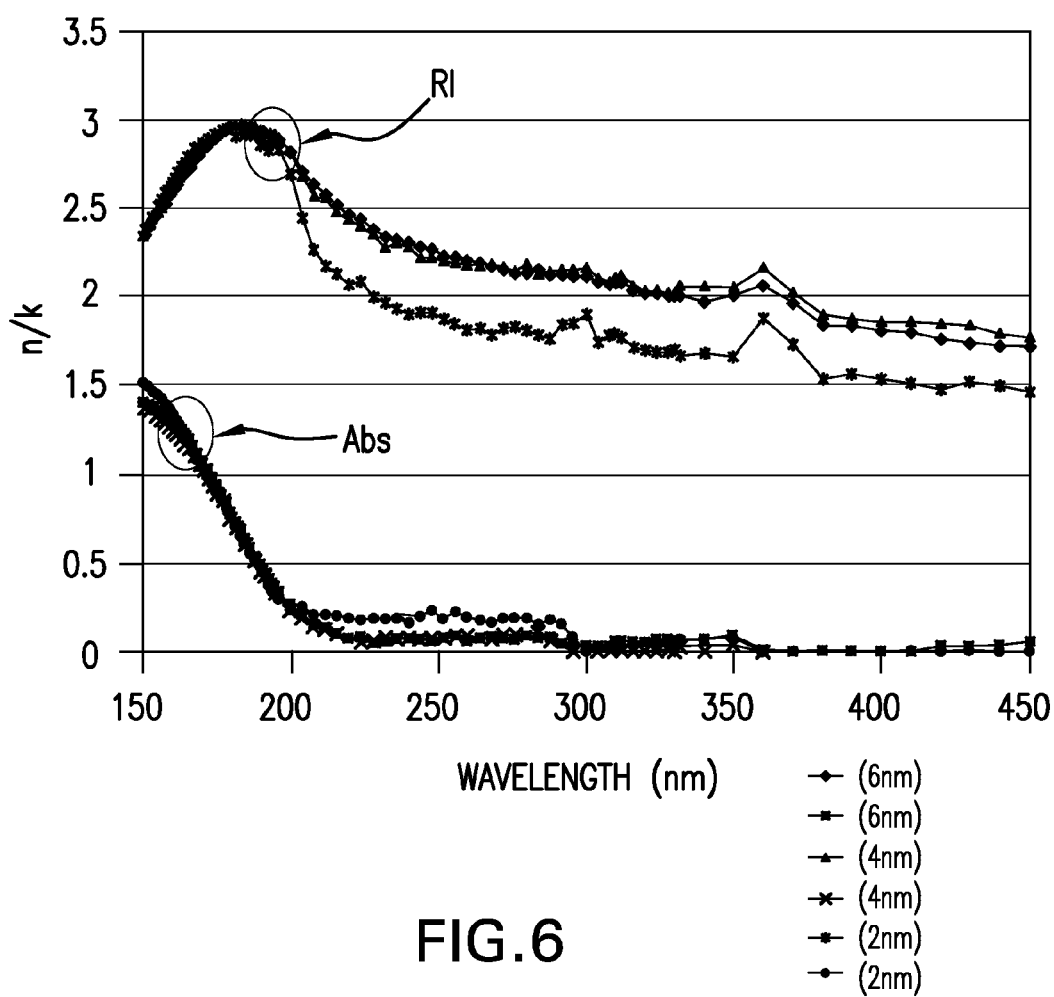
FIG. 6 is graph depicting refractive index and absorbance values for hafnium dioxide.

The refractive index of hafnium dioxide nanoparticles was estimated by measuring atomic layer deposition films of hafnium dioxide at various thicknesses (see FIG. 6). This refractive index ($n_s$) was measured to be 2.9 at 193 nm incident electromagnetic radiation. The following are examples of volume fractions ($V_s$) for hafnium dioxide nanoparticles are calculated for the specified refractive index targets:

Aqueous fluid with refractive index=1.8: $V_s$0.37[$n_m$(water)=1.43]
Aqueous fluid with refractive index=1.64: $V_s$=0.22
Organic (decalin-based) fluid with refractive index=1.8: $V_s$=0.19[$n_m$(decalin)=1.43]

FIG. 7 is a table of refractive index values calculated for resists incorporating hafnium dioxide nanoparticles in varying volume fractions.

Figure 9:
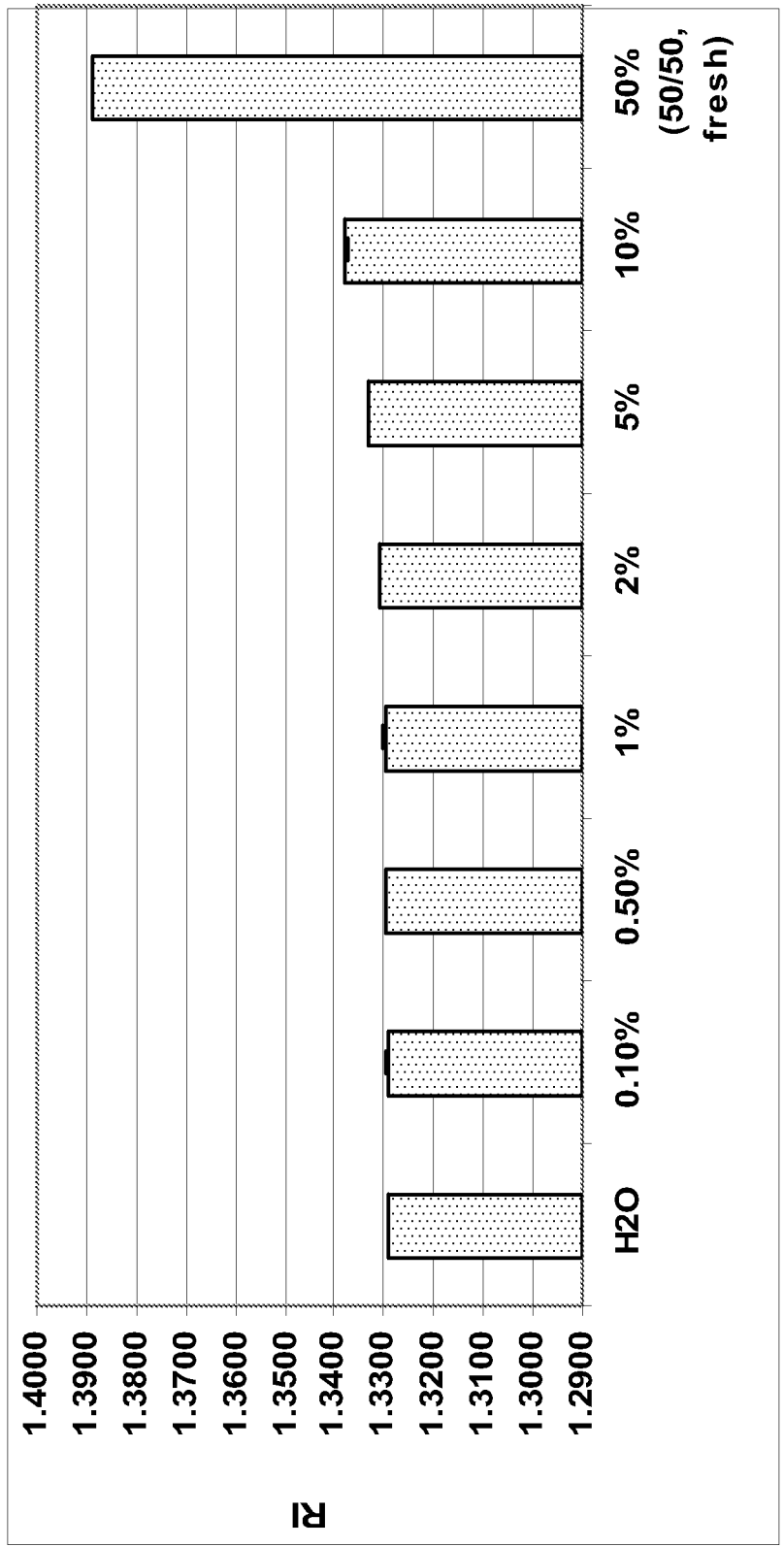
FIG. 9 is a graph presenting the refractive index measured at 589 nm incident radiation for compositions of matter that include various concentrations of hafnium dioxide particles incorporated in an aqueous fluid.

FIG. 9 is a graph presenting the refractive index measured at 589 nm incident radiation for compositions of matter that include various concentrations of hafnium dioxide particles in an aqueous fluid. Although these measurements were taken at the 589 nm sodium D line, where the refractive index of water is 1.33, the correlation between increased concentrations of hafnium dioxide nanoparticles and increased refractive index is illustrated.

The above embodiments may allow improved lithographic resolution through introduction of high refractive index materials. Embodiments of high refractive index materials implemented as immersion fluids and resists are presented, as are apparatuses and methods utilizing these materials.

All of the methods, apparatuses, and compositions of matter disclosed and claimed herein can be made and/or executed without undue experimentation in light of the present disclosure. While the apparatus and methods of this invention have been described in terms of preferred embodiments, it will be apparent to those of skill in the art that variations may be applied to the methods and in the steps or in the sequence of steps of the methods described herein without departing from the concept, spirit and scope of the invention. In addition, modifications may be made to the disclosed apparatuses and components may be eliminated or substituted for the components described herein where the same or similar results would be achieved. All such similar substitutes and modifications apparent to those skilled in the art are deemed to be within the spirit, scope and concept of the invention as defined by the appended claims

We claim:

1. A composition of matter comprising:
    a medium; and
    Hafnium dioxide nanoparticles incorporated in the medium, the Hafnium dioxide nanoparticles having a diameter less than or equal to about 15 nanometers;
    wherein said composition of matter is an immersion fluid or a resist.

2. The composition of matter of claim 1, wherein said composition of matter is an immersion fluid.

3. The composition of matter of claim 2, wherein said immersion fluid is aqueous.

4. The composition of matter of claim 2, wherein said immersion fluid is organic.

5. The composition of matter of claim 1, wherein said composition of matter is a resist.

6. An apparatus comprising:
    a light source;
    a platform for supporting a work piece;
    a lens element positioned between the light source and the platform; and
    a composition of matter positioned between the lens element and the platform, the composition of matter comprising:
        a first medium; and
        first Hafnium dioxide nanoparticles incorporated in the first medium, the first Hafnium dioxide nanoparticles having a diameter less than or equal to about 15 nanometers;
    wherein said composition of matter is an immersion fluid or a resist.

7. The apparatus of claim 6, wherein said composition of matter is an immersion fluid.

8. The apparatus of claim 7, further comprising:
    a resist positioned between the immersion fluid and the work platform, the resist comprising:
        a second medium; and
        second Hafnium dioxide nanoparticles incorporated in the second medium, the second Hafnium dioxide nanoparticles having a diameter less than or equal to about 15 nanometers.

9. The apparatus of claim 8, the refractive index of the resist at 193 nanometer incident electromagnetic radiation being greater than or equal to the refractive index of the immersion fluid at 193 nanometer incident electromagnetic radiation.

10. The apparatus of claim 6, wherein said composition of matter is a resist.

11. A method for immersion lithography comprising:
    providing a light source;
    providing a lens element between the light source and a work piece;
    providing a composition of matter between the lens element and the work piece, the composition of matter comprising:
        a first medium; and
        first Hafnium dioxide nanoparticles incorporated in the first medium, the first Hafnium dioxide nanoparticles having a diameter less than or equal to about 15 nanometers; and
    exposing the work piece to light provided by the light source by passing light from the light source through the lens element and the composition of matter to the work piece;
    wherein said composition of matter is an immersion fluid or a resist.

12. The method of claim 11, wherein said composition of matter is an immersion fluid.

13. The method of claim 12, further comprising:
    providing a resist between the immersion fluid and the work piece, the resist comprising:
        a second medium; and
        second Hafnium dioxide nanoparticles incorporated in the second medium, the second Hafnium dioxide nanoparticles having a diameter less than or equal to about 15 nanometers; and
    exposing the resist to light provided by the light source by passing light from the light source through the lens element and the immersion fluid to the resist.

14. The method of claim 13, the refractive index of the resist at 193 nanometer incident electromagnetic radiation being greater than or equal to the refractive index of the immersion fluid at 193 nanometer incident electromagnetic radiation.

15. The method of claim 11, wherein said composition of matter is a resist.

* * * * *